United States Patent [19]

Mehendale et al.

[11] Patent Number: 5,751,162

[45] Date of Patent: *May 12, 1998

[54] FIELD PROGRAMMABLE GATE ARRAY LOGIC MODULE CONFIGURABLE AS COMBINATIONAL OR SEQUENTIAL CIRCUITS

[75] Inventors: Mahesh Mehendale, Banaglore, India; Shivaling Mahant-Shetti, Dallas, Tex.; Manisha Agarwala, Richardson, Tex.; Mark G. Harward, Dallas, Tex.; Robert J. Landers, Plano, Tex.

[73] Assignee: Texas Instruments Incorporated, Dallas, Tex.

[*] Notice: The term of this patent shall not extend beyond the expiration date of Pat. No. 5,633,601.

[21] Appl. No.: 659,990

[22] Filed: Jun. 7, 1996

Related U.S. Application Data

[63] Continuation of Ser. No. 417,573, Apr. 6, 1995, abandoned.

[51] Int. Cl.$^6$ .................................................. H03K 19/173
[52] U.S. Cl. .................................................. 326/37; 326/39
[58] Field of Search .................................. 326/37–41, 47

[56] References Cited

U.S. PATENT DOCUMENTS

| | | | |
|---|---|---|---|
| 4,642,487 | 2/1987 | Carter | 326/38 |
| 4,974,241 | 11/1990 | McClure et al. | 377/116 |
| 5,122,685 | 6/1992 | Chan et al. | 326/41 |
| 5,166,557 | 11/1992 | Chen et al. | |
| 5,258,668 | 11/1993 | Cliff et al. | 326/39 |
| 5,349,250 | 9/1994 | New | 326/53 |
| 5,448,185 | 9/1995 | Kaptanoglu | 326/39 |
| 5,451,887 | 9/1995 | El Ayat et al. | 326/39 |
| 5,488,315 | 1/1996 | Mahant-Shetti et al. | 326/37 |
| 5,504,440 | 4/1996 | Sasaki | 326/39 |
| 5,633,601 | 5/1997 | Nagaraj | 326/38 |

OTHER PUBLICATIONS

Agarwala, Manisha & Balsara, Poras T., "Application Specific Logic Module Architecture for FPGAs", *IEE 1992 Custom Integrated Circuits Conference*, pp. 4.1.1–4.1.4.

*Primary Examiner*—Jon Santamauro
*Attorney, Agent, or Firm*—Gerald E. Laws; C. Alan McClure; Richard L. Donaldson

[57] ABSTRACT

A logic module 400 for use in a field programmable gate array 100 can be selectively reconfigured to perform over 2,200 boolean combinational functions on output 431, to operate as a full adder with sum and carry outputs, or to perform the sequential function of a D latch or a D flipflop. Logic module 400 is comprised of 2-input multiplexers 500 and 600 which are used to form both the combinational and sequential circuits, thereby efficiently utilizing space on gate array 100.

17 Claims, 11 Drawing Sheets

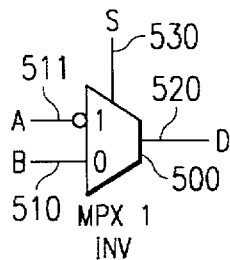
*FIG. 5A*
| S | A | B | D |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 1 |
| 1 | 0 | 1 | 1 |
| 1 | 1 | 0 | 0 |
| 1 | 1 | 1 | 0 |
*FIG. 5B*
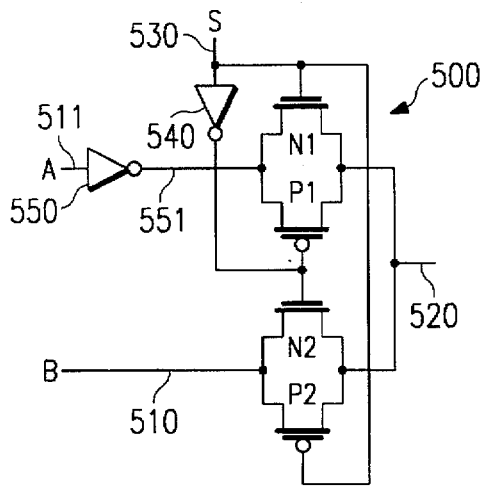
*FIG. 5C*
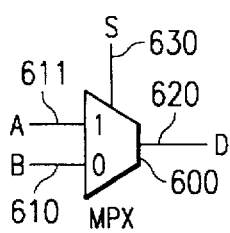
*FIG. 6A*
| S | A | B | D |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |
*FIG. 6B*
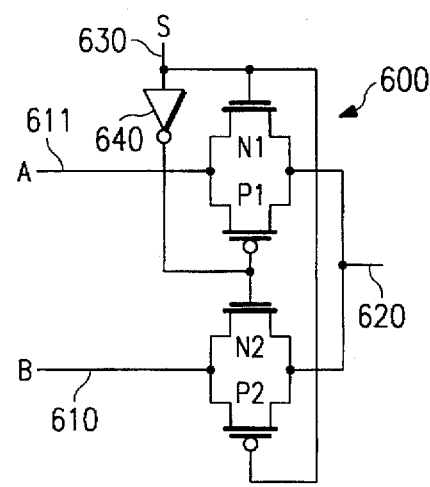
*FIG. 6C*

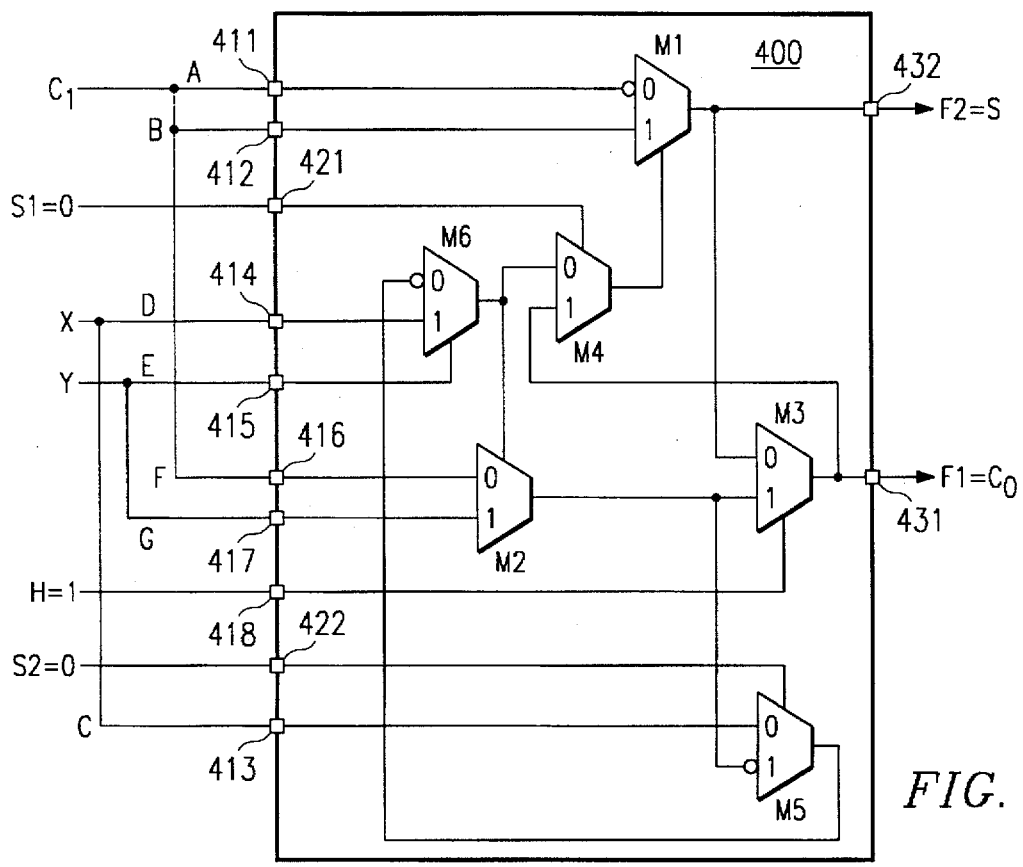
*FIG. 8A*
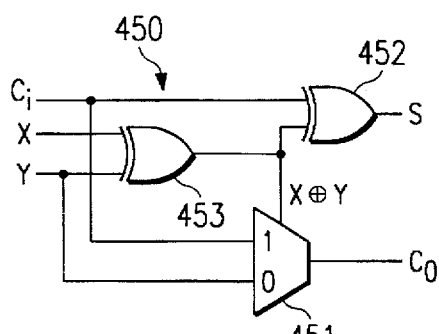
*FIG. 8B*
| X | Y | $C_i$ | $X \oplus Y$ | S | $C_0$ |
|---|---|---|---|---|---|
| 0 | 0 | 0 | 0 | 0 | 0 |
| 0 | 0 | 1 | 0 | 1 | 0 |
| 1 | 1 | 0 | 0 | 0 | 1 |
| 1 | 1 | 1 | 0 | 1 | 1 |
| 0 | 1 | 0 | 1 | 1 | 0 |
| 0 | 1 | 1 | 1 | 0 | 1 |
| 1 | 0 | 0 | 1 | 1 | 0 |
| 1 | 0 | 1 | 1 | 0 | 1 |
*FIG. 8C*
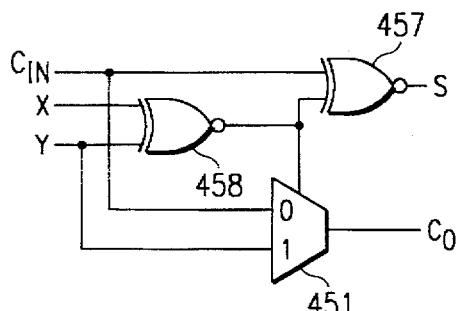
*FIG. 8D*
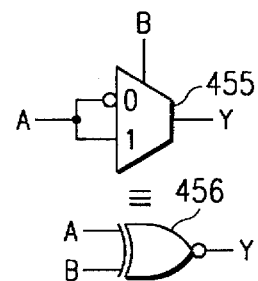
*FIG. 8E*

FIELD PROGRAMMABLE GATE ARRAY LOGIC MODULE CONFIGURABLE AS COMBINATIONAL OR SEQUENTIAL CIRCUITS

This application is a continuation of application Ser. No. 08/417,573, filed Apr. 6, 1995, now abandoned.

FIELD OF THE INVENTION

The present invention relates to electronic circuits and, more specifically, to field programmable gate array (FPGA) logic modules that achieve improved performance and silicon area efficiency characteristics and methods for forming such a module.

BACKGROUND OF THE INVENTION

Field programmable gate arrays (FPGA) are integrated circuits that may be configured, or programmed, by the user to form complex logic circuits. Programming is performed after the FPGA is manufactured, generally at the site of the purchaser, or "in the field." FPGA's provide many of the advantages of custom integrated circuits, such as complex functions in a single package, low power consumption, etc. Small quantities of such circuits can be created using FPGA's much less expensively than a custom integrated circuit. FPGAs combine the flexibility of mask programmable gate arrays with the convenience of field programmability.

FPGA's have two primary elements: (1) a two dimensional array of universal logic modules and (2) a corresponding array of programmable interconnects to form the selective programmable connections between the logic modules. The universal logic modules are made up of a number of functional devices such as diodes, transistors, logic gates, multiplexers, and the like. The logic modules are interconnected by selectively programming the programmable interconnects to establish connections between the outputs of one logic module and the inputs of other logic modules. The programmable interconnects may be fuses, antifuses, or other means. Signals generated external to the FPGA are also connected by antifuses to the inputs of various logic modules. Output signals from selected logic modules are connected by antifuses to outputs of the FPGA. The output of each logic module is a logical combination of the inputs of that logic module and may correspond to, for example, digital logic devices such as NAND gates, AND gates, and OR gates. A typical logic module will have approximately eight inputs and can be connected so that any one of several hundred boolean combinations of one to eight input signals is produced at the output.

Prior art FIG. 1 shows a portion of a typical FPGA 100. Six logic modules 101 are shown, arranged in two rows of three. The array size of a typical FPGA may be 12 by 40, for example, or larger. Each logic module has a plurality of inputs 102a-102h and an output 104. An interconnect network comprising vertical tracks and horizontal tracks may be selectively configured by programming fuses or antifuses to interconnect the logic modules, as described in U.S. Pat. No. 5,166,557 entitled Gate Array with Built-in Programming Circuitry. The horizontal tracks are typically broken into smaller segments to allow flexibility in establishing the selected connections.

Still referring to prior art FIG. 1, a plurality of external input signals are connected to a plurality of external pins, such as pin 116, buffered by receivers, such as receiver 118, and placed on horizontal track segments, such as segment 112a. Horizontal segment 112a may be connected to horizontal segment 114a by programming antifuse 108 to be conductive. Other horizontal segments may be similarly interconnected. One of a plurality of horizontal track segments 112a-112d may be selectively connected to the logic module inputs, such as input 102a, by programming one of antifuses 106a-106d to be conductive. Each logic module 101 has an output, such as output 104, connected to a vertical track, such as track 110. Output 104 may be connected to a plurality of horizontal segments, such as segments 112a-112d and segments 124a-124d, by programming any of antifuses 107a-107d and 109a-109d, respectively, to be conductive. A plurality of output drivers, such as driver 122, connect to a plurality of output pins, such as pin 120, to drive a plurality of external signals.

Prior art FIG. 2 shows FPGA logic module 101 comprising multiplexers 210, 212, 214, AND gate 216 and NOR gate 218. Various combinational results of signals placed on input terminals 102a-102h can be formed and placed on output terminal 104, for example: 102e AND 102f, 102e AND 102f AND 102d, 102g NOR 102h, etc, as is well understood to those skilled in the art. Typically, approximately several hundred logical combinations of input terminals 102a-102h can be formed. An adder circuit can be formed by interconnecting three modules 101.

Prior art FIG. 3 shows an FPGA logic module 300 which is comprised of logic module 101, of the type illustrated in FIG. 2, connected to logic module 302. Logic module 302 typically provides a latch and/or flipflop function which allows the signal leaving module 101 to be either latched or passed through without being latched. Control signals 304a and 304b control what function module 302 performs. The end result is that logic module 300 can be reconfigured to perform various combinational logic functions or a sequential latch function.

When a FPGA is used to implement a complex logic circuit, portions of the logic circuit typically require combinational logic functions, while other portions of the logic circuit typically require sequential logic functions. However, if logic module 300 is used as a combinational logic function, then module 302 may be essentially unused. Likewise, if logic module 300 is used as a sequential latch function, then logic module 101 may be essentially unused. Space on the FPGA may be wasted since large amounts of logic modules may not be usable in any given application. Furthermore, several logic modules 300 may be needed to create commonly used logic functions, such as an adder, thereby undesirably reducing the maximum size of a logic circuit that can be created on a single FPGA 100 by the user.

Accordingly, it is an object of the invention to create a logic module that uses less space so that more logic modules can be placed in a given FPGA.

Another object of the invention is to create a logic module that is capable of performing more logic functions than prior art modules.

Another object of the invention is to create a logic module that an be configured either as combinational or sequential, thus providing flexibility in terms of combinational versus sequential logic mix in the FPGA.

Other objects and advantages will be apparent to those of ordinary skill in the art having reference to the following figures and specification.

SUMMARY OF THE INVENTION

In accordance with the present invention, a logic module for use in a field programmable gate array is provided that can be selectively reconfigured to perform over 2,200 boolean combinational functions, to operate as a full adder with sum and carry outputs, or to perform the sequential function of a D latch or a D flipflop. The logic module has ten input terminals and two output terminals.

Another aspect of the current invention is the efficiency of space utilization. The logic module is comprised entirely of two input multiplexers which advantageously may be used to perform both the combinational and sequential functions.

BRIEF DESCRIPTION OF THE DRAWINGS

Other features and advantages of the present invention will become apparent by reference to the following detailed description when considered in conjunction with the accompanying drawings; in which:

FIGS. 5A–5C illustrate the construction and function of the inverting input multiplexers used in FIG. 4, FIGS. 6A–6C illustrate the construction and function of the non-inverting multiplexers used in FIG. 4, FIGS. 7A–7B illustrate the logic module of FIG. 4 configured as a pure combinational block, FIGS. 8A–8F illustrate the logic module of FIG. 4 configured as a full adder circuit.

Corresponding numerals and symbols in the different figures and tables refer to corresponding parts unless otherwise indicated.

DETAILED DESCRIPTION OF THE INVENTION

Figure 1:
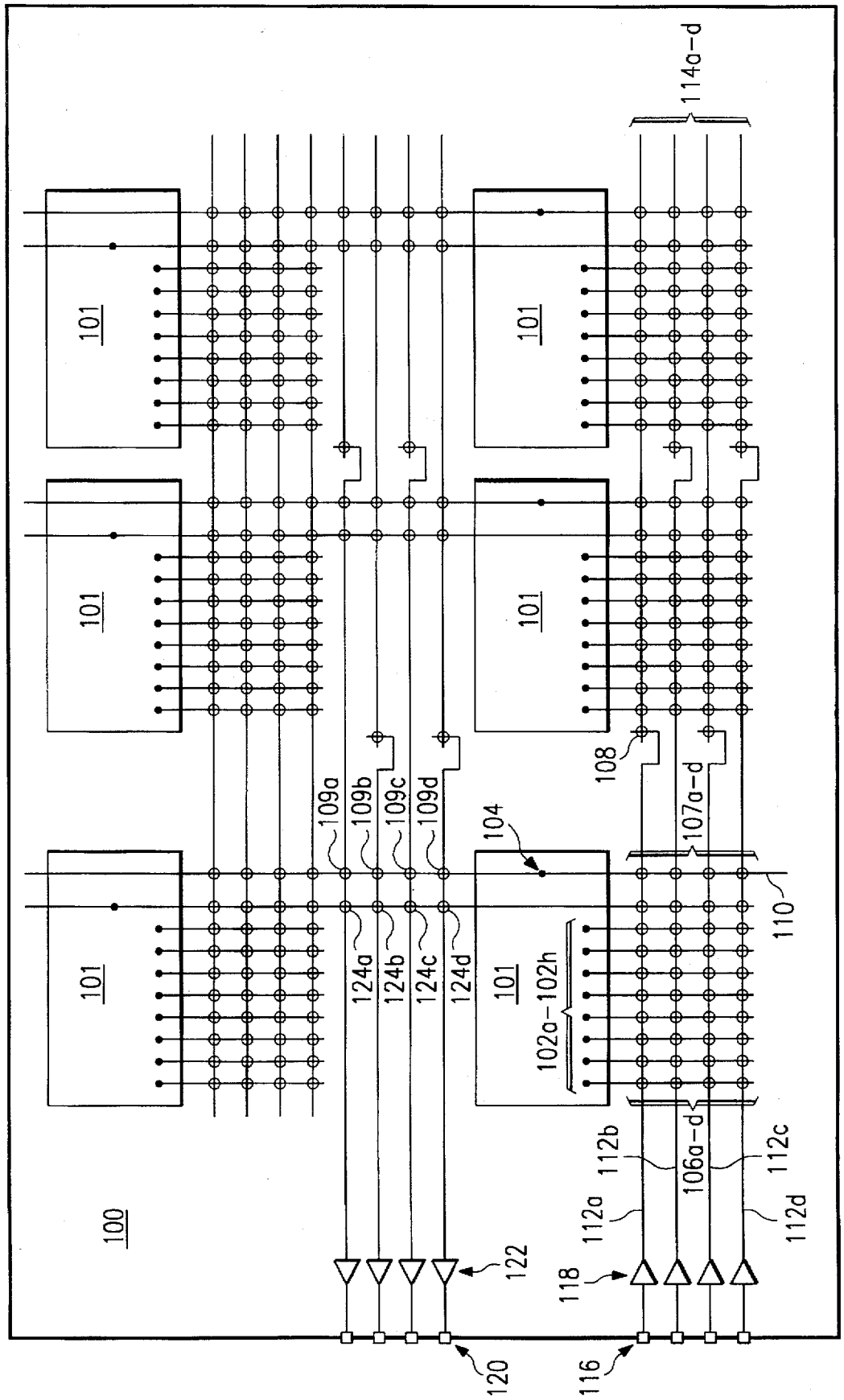
FIG. 1 is a prior art FPGA illustrating logic modules and an interconnection network.
Figure 2:
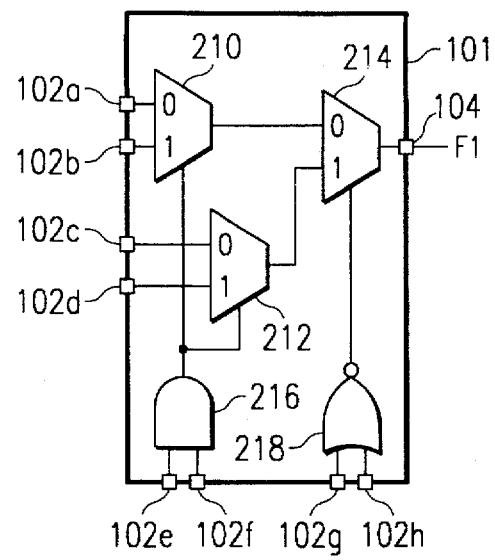
FIG. 2 is a prior art logic module illustrating the logic elements within the logic modules of FIG. 1.
Figure 3:
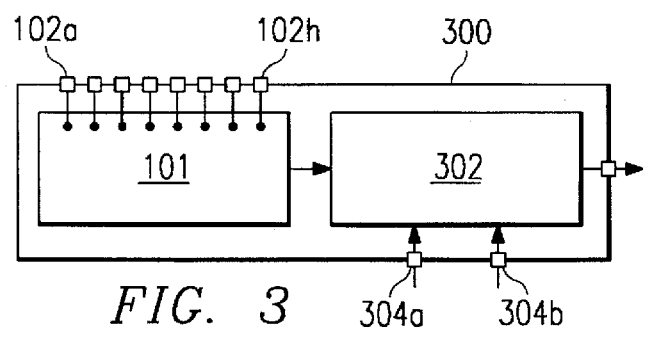
FIG. 3 is a prior art logic module illustrating an alternate logic module of FIG. 1 having both a combinational part and a separate sequential part.

Prior art FIG. 1 illustrates a portion of a field programmable gate array 100, hereinafter referred to as a "FPGA," which contains multiple logic modules 101 and an interconnection network. Logic module 101 is illustrated in prior art FIG. 2. The interconnect network is comprised of vertical and horizontal tracks, such as vertical track 110, horizontal track segments 106a–106d and 114a–114d. The interconnect network can be programmed to selectively interconnect the output terminal 104 of one module 101 with the input terminals 102a–102h of various other logic modules 101. Programming is performed by causing antifuses, such as antifuses 106a–106d, 107a–107d and 108, to become conductive in response to a voltage pulse that programs each selected antifuse, as is well know by those skilled in the art. The present invention is a new logic module that can be used in FPGAs, such as FPGA 100, to advantageously increase the functionality of FPGA 100. Functionality is increased by advantageously increasing the number of functions that can be performed by each logic module in order to advantageously reduce the chip area utilized to form the circuits to perform many desirable complex digital logic functions, as compared to the chip area utilized by prior art FPGAs.

Figure 4:
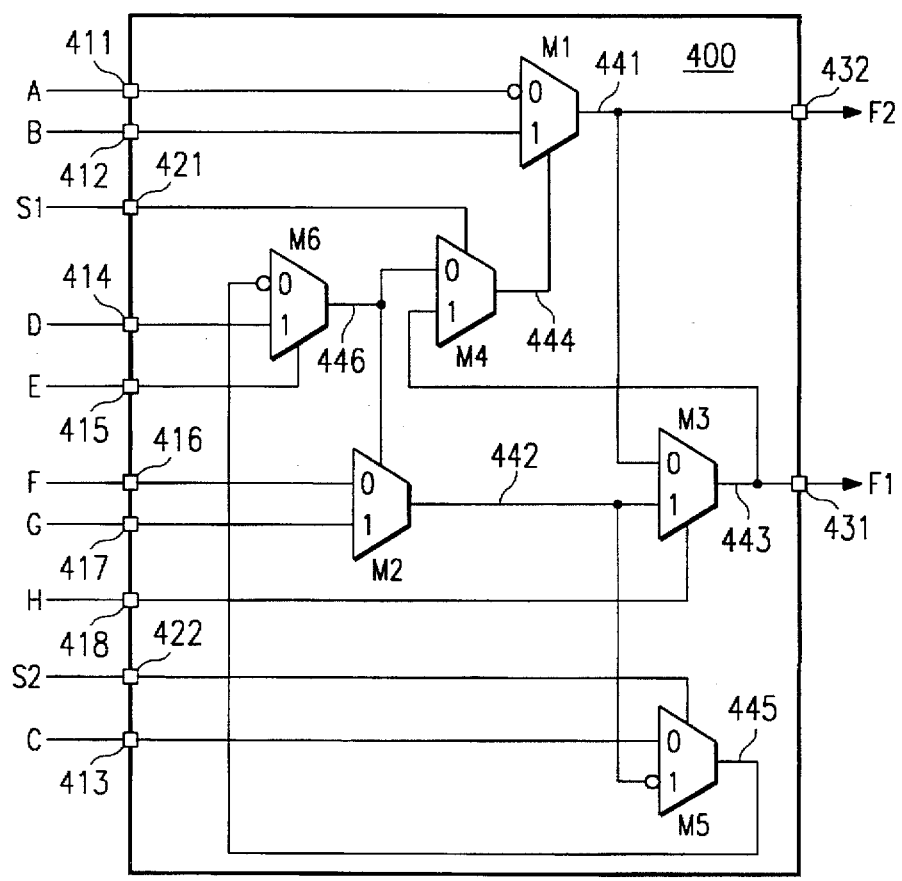
FIG. 4 shows a logic module formed in accordance with the present invention.

FIG. 4 shows a logic module 400 formed in accordance with the present invention. Logic module 400 comprises a plurality of interconnected logic elements M1–M6. Each logic element M1–M6 is a two input multiplexer, or mux. Muxes M1, M5, and M6 have one inverting input; the rest have two non-inverting inputs. A plurality of input terminals 411–418 and 421–422 receive data and control signals that are generated external to logic module 400. Two output terminals 431–432 provide output signals for use external to logic module 400.

FIGS. 5A–5C illustrate a two input mux 500 which is representative of the muxes having one inverting input shown in FIG. 4. FIG. 5A shows 0-input 510, inverting 1-input 511, select control 530, and output 520. FIG. 5B shows the digital logic truth table for mux 500. FIG. 5C shows the construction of mux 500. Select control 530 connects to inverter 540, the gate of transistor N1 and the gate of transistor P2. The output of inverter 540 connects to the gates of transistors P1 and N2. Inverter 550 inverts a signal connected to inverting 1-input 511. An output 551 of inverter 550 connects to one end of transistors N1 and P1, while output 520 of mux 500 connects to the other end of transistors N1 and P1. Likewise, a signal connected to 0-input terminal 510 is connected to one end of transistors N2 and P2, while output 520 connects to the other end of transistors N2 and P2. When a binary low signal is placed on select control 530, mux 500 is configured to place a binary signal on output 520 that is equivalent to a signal placed on 0-input 510. Likewise, when a binary high signal is placed on select control 530, mux 500 is configured to place a binary signal on output 520 equivalent to an inversion of a signal placed on inverting 1-input 511, as illustrated by FIG. 5B.

FIGS. 6A–6C illustrate mux 600 which is representative of the muxes in FIG. 4 having two non-inverting inputs. The operation of mux 600 is identical to the operation of mux 500, except for the inversion of one input on mux 500. FIG. 6A shows 0-input 610 and 1-input 611, select input 630 and output 620. FIG. 6B shows the truth table describing the operation of mux 600. FIG. 6C illustrates an implementation of mux 600 using four transistors N1, N2, P1 and P2 and inverter 640.

Returning to FIG. 4, a mux M1 has an inverting 0-input connected to an input terminal 411, a 1-input connected to an input terminal 412, a select control connected to an output 444 of a mux M4, and an output 441 connected to an output terminal 432.

A mux M2 has a 0-input connected to an input terminal 416, a 1-input connected to an input terminal 417, a select control connected to an output 446 of a mux M6, and an output 442.

A mux M3 has a 0-input connected to output 441 of mux M1, a 1-input connected to output 442 of mux M2, a select control connected to an input terminal 418, and an output 443 connected to an output terminal 431.

Mux M4 has a 0-input connected to output 446 of mux M6, a 1-input connected to output 443 of mux M3, a select control connected to control input terminal 421, and an output 444.

A mux M5 has a 0-input connected to an input terminal 413, an inverting 1-input connected to output 442 of mux M2, a select control connected to a control input terminal 422, and an output 445.

Mux M6 has an inverting 0-input connected to output 445 of mux M5, a 1-input connected to an input terminal 414, a select control connected to an input terminal 415, and an output 446.

Control input terminals 421 and 422 are distinguished from input terminals 411–418 in that they are used to reconfigure logic module 400 to perform one of the following four different logical functions: boolean combinational logic of various input terminals 411–418, full adder with carry out, D latch with preset and clear inputs and a high or low enable clock, and D flipflop with preset and clear inputs and low to high or high to low clock triggering. These functions are explained in more detail in the following paragraphs. Typically, the signals applied to control inputs 421–422 will be fixed at either a logic 0 or a logic 1 when FPGA 100 is programmed and therefore may require only two antifuses, one to logic low, such as ground, and one to logic high, such as $V_{cc}$. However, this is not a requirement of the present invention. Reducing the number of antifuses saves space on the integrated circuit and reduces capacitive loading on the effected tracks. Inputs 421–422 can be treated identically to inputs 411–418. If control inputs 421–422 are treated as data inputs, then the logic function performed by module 400 can by dynamically reconfigured in response to the state of inputs 421–422.

Figure 7A:
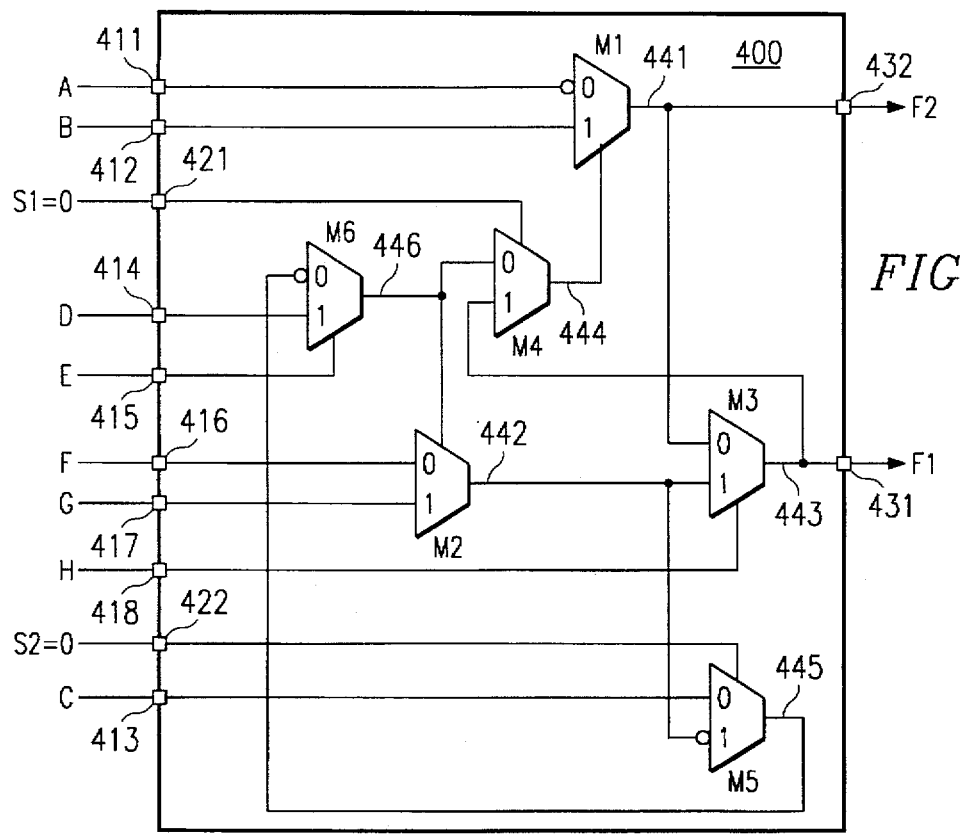
Figure 7B:
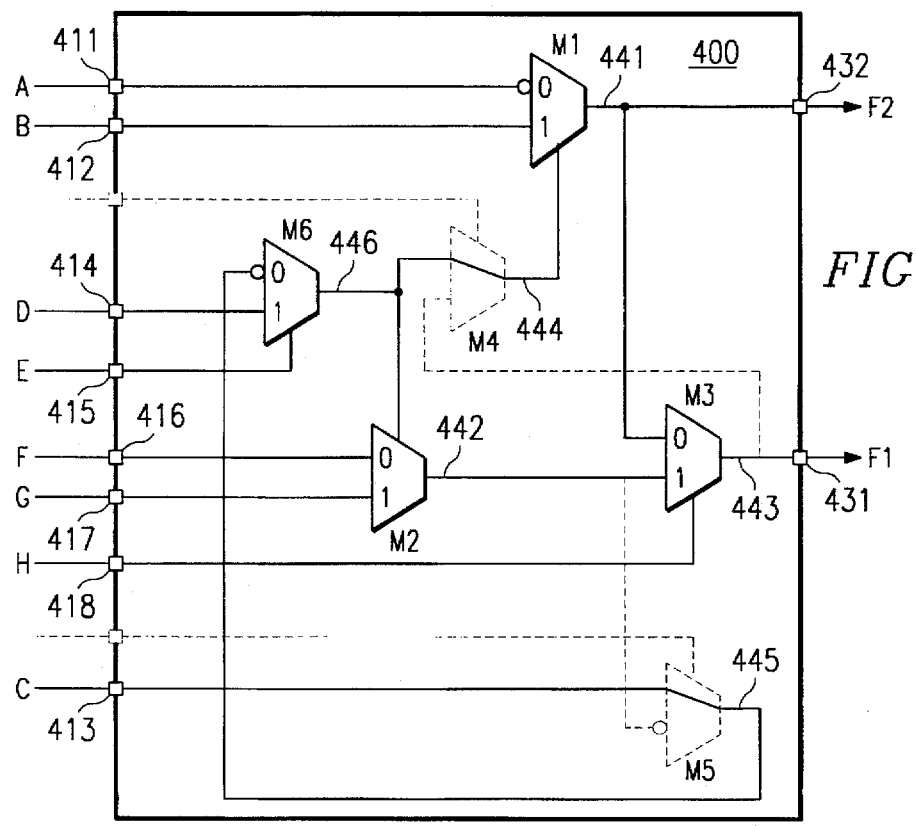

FIGS. 7A–7B illustrates logic module 400 configured as a pure combinational block. Control signals S1 and S2 are set to a logical 0 and placed on control inputs 421 and 422, respectively. This causes muxes M4 and M5 to configure logic module 400 as shown in FIG. 7B. In FIG. 7B, muxes M4 and M5 are not shown, even though in reality they are still present, so that the resultant configuration can be more clearly seen. Mux M4 passes signal 446 to the select input of M1. Mux M5 passes an input signal C placed on input terminal 413 to the 0-input of M6. The signal propagation delay introduced by muxes M4 and M5 may be minimized by suitable design techniques known to those skilled in the art, such as optimum selection of width/length ratios of the transistors comprising the muxes. Various input signals A–H can now be placed on input terminals 411–418 to produce various logical combinations of the input signals at outputs 431 and 432, as is well known by those skilled in the art.

As shown in Table 1 and according to the present invention, any one of over 2,200 combinational functions of one to eight of the inputs 411–418 can be created on output 431. The use of multiplexers for all of the logic elements within logic module 400 advantageously results in significantly more combinational functions than the prior art.

TABLE 1

| No of Inputs | PRIOR ART | Module 400 output 431 | Module 400 output 432 |
| --- | --- | --- | --- |
| 1 | 2 | 2 | 2 |
| 2 | 8 | 8 | 8 |
| 3 | 48 | 65 | 22 |
| 4 | 238 | 694 | 12 |
| 5 | 319 | 1120 | 1 |
| 6 | 130 | 332 | — |
| 7 | 20 | 33 | — |
| 8 | 1 | 1 | — |
| Total | 766 | 2255 | 45 |

FIG. 8A illustrates logic module 400 configured as a full adder circuit. Control signals S1 and S2 are set to a logical 0 and placed on control inputs 421 and 422, respectively. Input signal H is set to logical 1 and placed on input 418. Input signal C on input 413 and signal D on input 414 are connected together and represents a first addend X. A second addend Y is applied to inputs 415 and 417. A carry-in signal $C_i$ is applied to inputs 411, 412, and 416. A sum signal S, of $X+Y+C_i$ is produced on output terminal 432, while a carry-out signal $C_o$, is produced on output 431.

In order to better understand the operation of the adder, FIG. 8B illustrates a full adder 450 circuit drawn using XOR gates 452 and 453 and mux 451. If signal X and Y are both logical 1 or both logical 0, gate 453 will cause mux 451 to reproduce the binary state of signal Y, which is also the same state as signal X, as output signal $C_o$. This in accordance with the operation of an adder in which a carry-out is produced if both addends are 1. Likewise, a carry-out does not occur if both addends are 0. If only one addend X or Y is 1, mux 451 will reproduce the binary state of signal $C_i$ as output signal $C_o$. This is in accordance with the need to generate a carry-out $C_o$ equal to logical 1 if carry-in $C_i$ is logical 1 and one addend X or Y is logical 1. FIG. 8C illustrates the truth table for adder 450. FIG. 8D illustrates an adder 460 which is similar to adder 450. Adder 460 is comprised of XNOR gates 457 and 458 and mux 451. Note that signal $C_i$ and signal Y are reversed on mux 451. Adder 460 produces the same signal S and signal $C_o$ as adder 450. FIG. 8E illustrates how mux 455 is logically equivalent to XNOR gate 456.

Figure 8F:
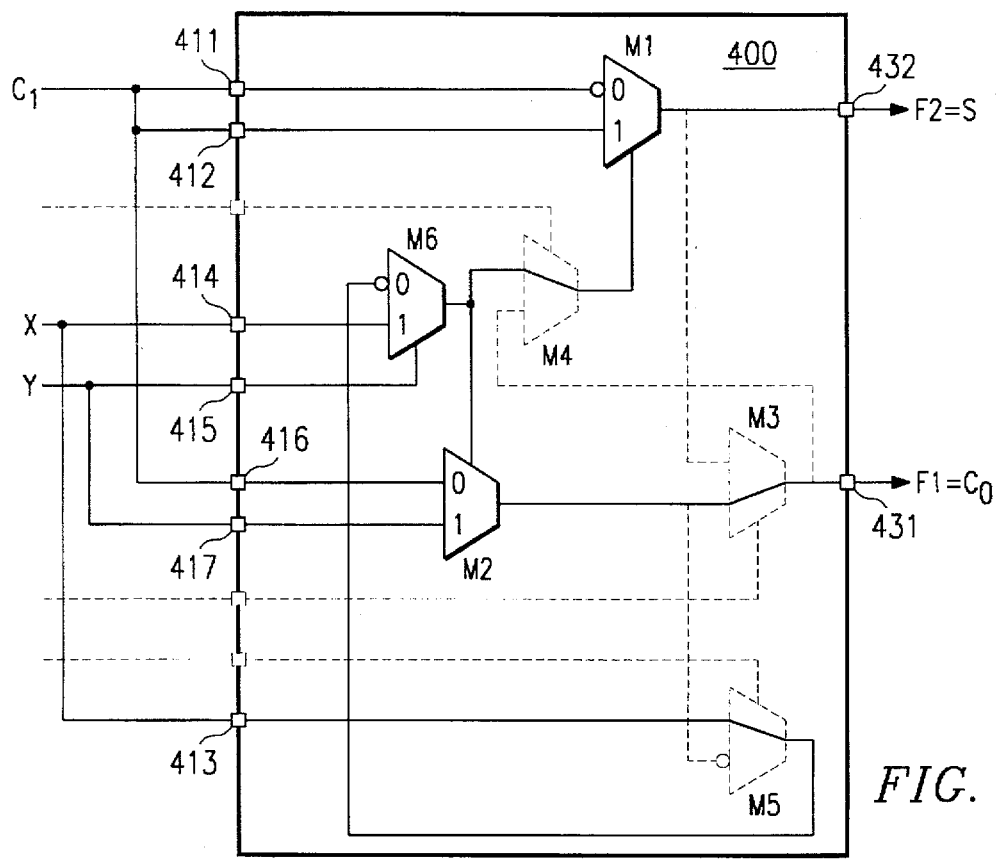

With the above in mind, refer to FIG. 8F which illustrates the resultant circuit of logic module 400 configured as an adder circuit with muxes M3–M5 not shown for clarity. Mux M1 is equivalent to gate 457, mux M6 is equivalent to gate 458 and mux M2 is equivalent to mux 451 of FIG. 8D. Therefore, logic module 400 configured as a full adder provides a sum signal S on output 432 and a carry out signal $C_o$ on output 431 in accordance with the truth table shown in FIG. 8C.

Figure 9A:
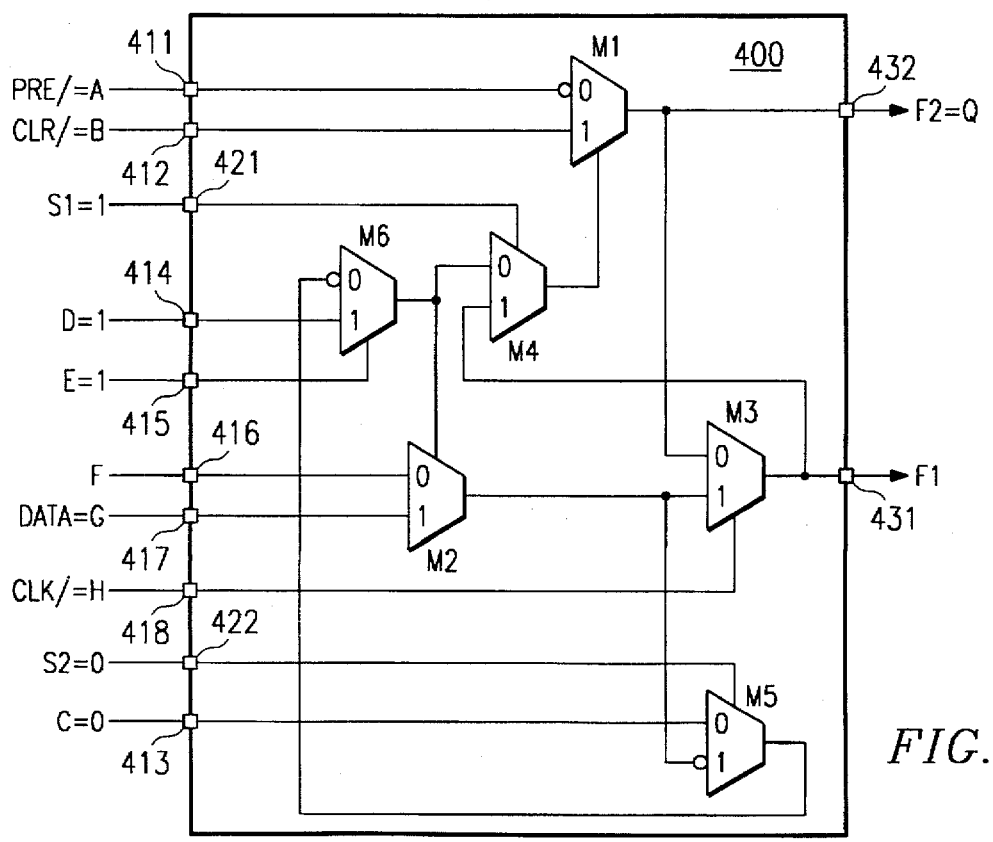
FIGS. 9A–9D illustrate the logic module of FIG. 4 configured as a D latch circuit.

FIG. 9A illustrates logic module 400 configured as a D latch circuit. Control signal S1 is set to logic 1 and applied to input terminal 421. Control signal S2 is set to logic 0 and applied to input 422. Input signal C is set to logic 0 and applied to input terminal 413. Input signals D and E are set to logic 1 and applied to input terminals 414–415. This selection of input signals C–E, S1 and S2 cause muxes M2, and M4–M6 to configure module 400 as a D latch. FIG. 9C illustrates logic module 400 with muxes M2 and M4–M6 not shown, even though in reality they are still present, so that the resultant configuration can be more clearly seen.

Figure 9B:
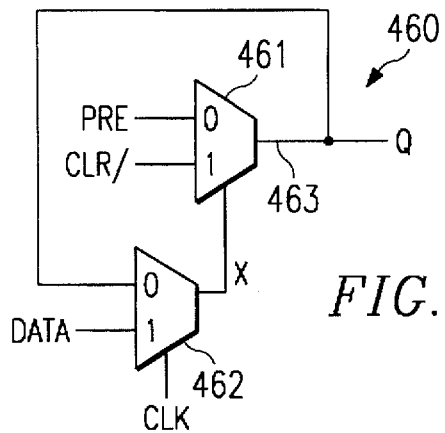
Figure 9C:
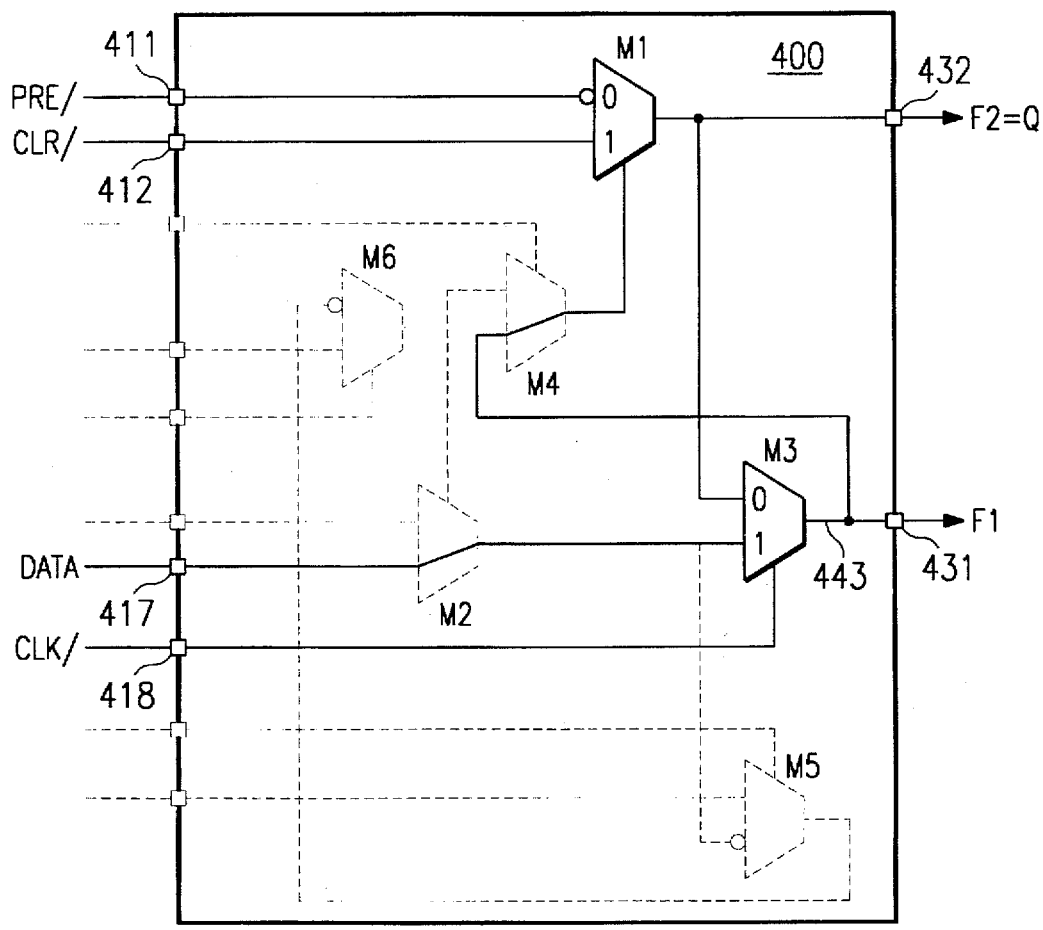

To better understand the operation of the D latch, refer now to FIG. 9B which illustrates a simple D latch 460 comprised of a mux 461 and a mux 462. A signal 463 provides a feedback path which feeds the output of mux 461 back to the 0-input of mux 462. When a clock signal CLK is high, a data signal DATA is enabled to pass through mux 462 and is represented on signal X which is connected to the select input of mux 461. Signal 463, which is also referred to as signal Q, of mux 461 can be represented in boolean notation as:

Q=((PRE) AND (X/)) OR ((CLR/) AND (X))

where the notation "/" means "inverted" or "negated" Thus, when signal PRE and CLR are both logical 0, then output signal Q=signal X. When the clock signal CLK goes low, feedback signal 463 is selected from the 0-input of mux 462 and the state of signal DATA is latched in D latch 460.

If preset signal PRE is set to a logic 1, output signal Q and feedback signal 463 will also become logic 1 and D latch 460 will become "set" to logic state 1. Likewise, if clear signal CLR is set to logic 1, output signal Q and feedback signal 463 will become logic 0 and D latch 460 will become "cleared" to logic state 0.

The D latch circuit that is configured in module 400 and illustrated in FIG. 9C operates similarly to latch 460 of FIG.

9B. A data signal DATA is applied to input terminal 417. A clock signal CLK/ is applied to input terminal 418. An inverted preset signal PRE/ is applied to terminal 411 and an inverted clear signal CLR/ is applied to terminal 412. Mux M3 passes the state of signal DATA to mux M1 when signal CLK/ on terminal 418 is a logic 1. Mux M1 reproduces the state of signal DATA on output 441 if signals CLR and PRE are both logic 0. Output 441 is feed back to the 0-input of mux M3. Hence, when signal CLK/ on terminal 448 goes to logic 0, the state of signal DATA is latched in the D latched formed in logic module 400 and output terminal 432 provides a signal Q which represents the latched state of signal DATA. Output terminal 431 also provides signal 441 which is approximately equivalent to signal Q.

Figure 9D:
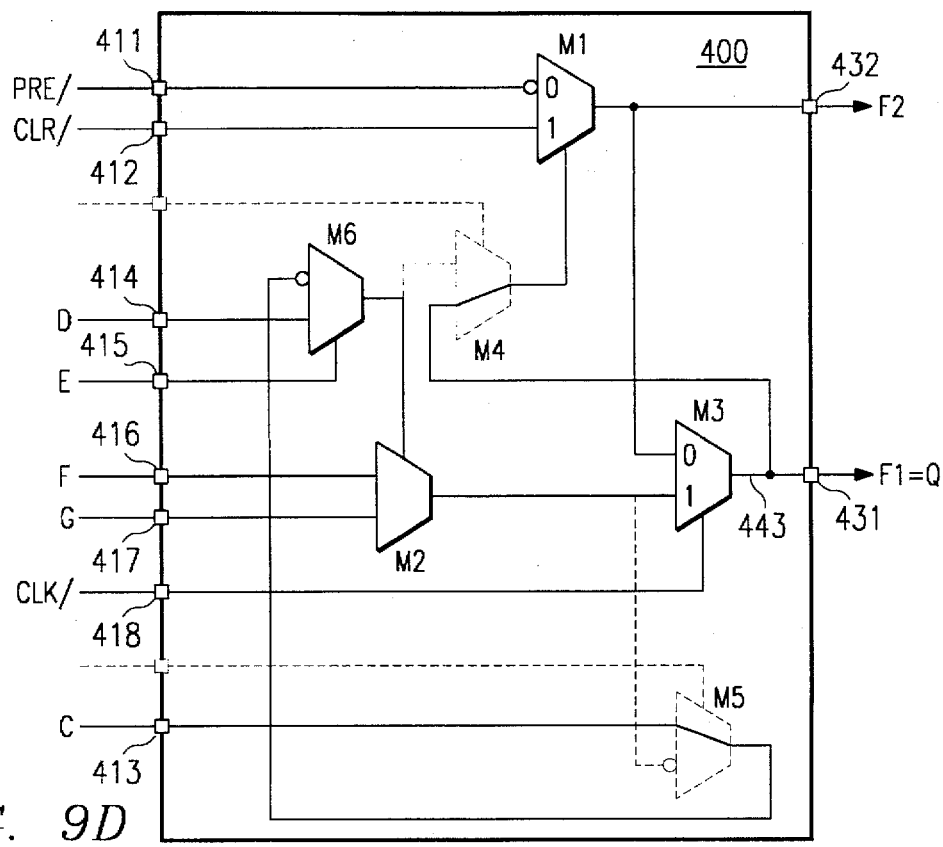

Referring to FIG. 9D, muxes M2, and M5–M6 may be advantageously used to form combinational functions of inputs 413–417 prior to being latched. This is accomplished by using some or all of signals C–G as logic signals.

Figure 10A:
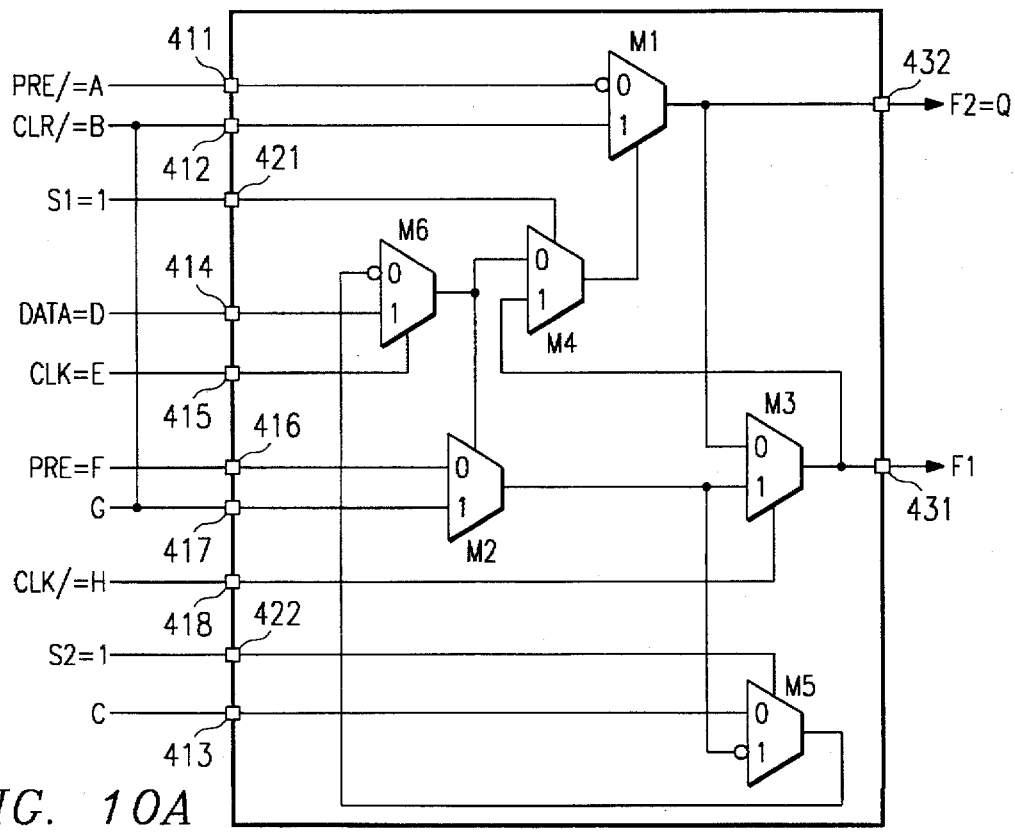
FIGS. 10A–10D illustrate the logic module of FIG. 4 configured as a D flipflop circuit.

FIG. 10A illustrates logic module 400 configured as a D flipflop circuit. Control signal S1 is set to logic 1 and applied to input terminal 421. Control signal S2 is set to logic 1 and applied to input 422. This selection of input signals S1–S2 cause muxes M4–M5 to configure module 400 as a D flipflop. FIG. 10D illustrates logic module 400 with muxes M4 not shown and mux M5 shown as an inverter, even though in reality they are still present, so that the resultant configuration can be more clearly seen.

Figure 10B:
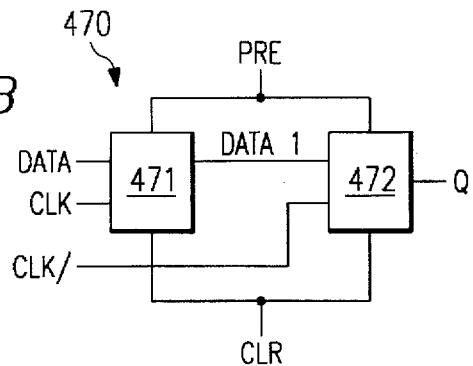

To better understand the operation of the D flipflop, refer now to FIG. 10B which illustrates a D flipflop 470 comprised of D latches 471 and 472. A clock signal CLK is connected to active high D latch 471. A data signal DATA is connected to latch 471 and appears at output DATA1 when signal CLK is high. Inverted signal CLK/ is also connected to active high D latch 472. When signal CLK is a logic high, signal CLK/ is a logic low, and visa versa. Therefore, when signal CLK transitions from logic high to logic low, the binary state of signal DATA is latched in latch 471 and latch 472 now transfers the state of latched signal DATA1 to output Q. This sequence is referred to as "triggering" the flipflop with a "negative edge". Preset signal PRE sets the state of flipflop 470, as indicated by output Q, to logic 1 when signal PRE is a logic high, while clear signal CLR clears the state of flipflop 470 to logic 0 when signal CLR is a logic high.

Figure 10C:
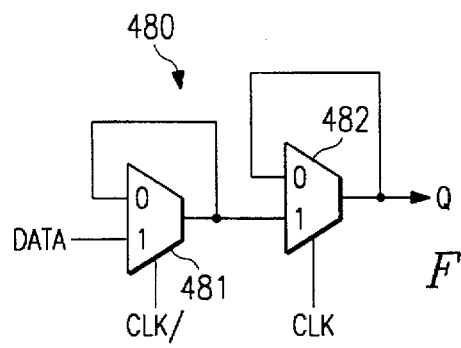
Figure 10D:
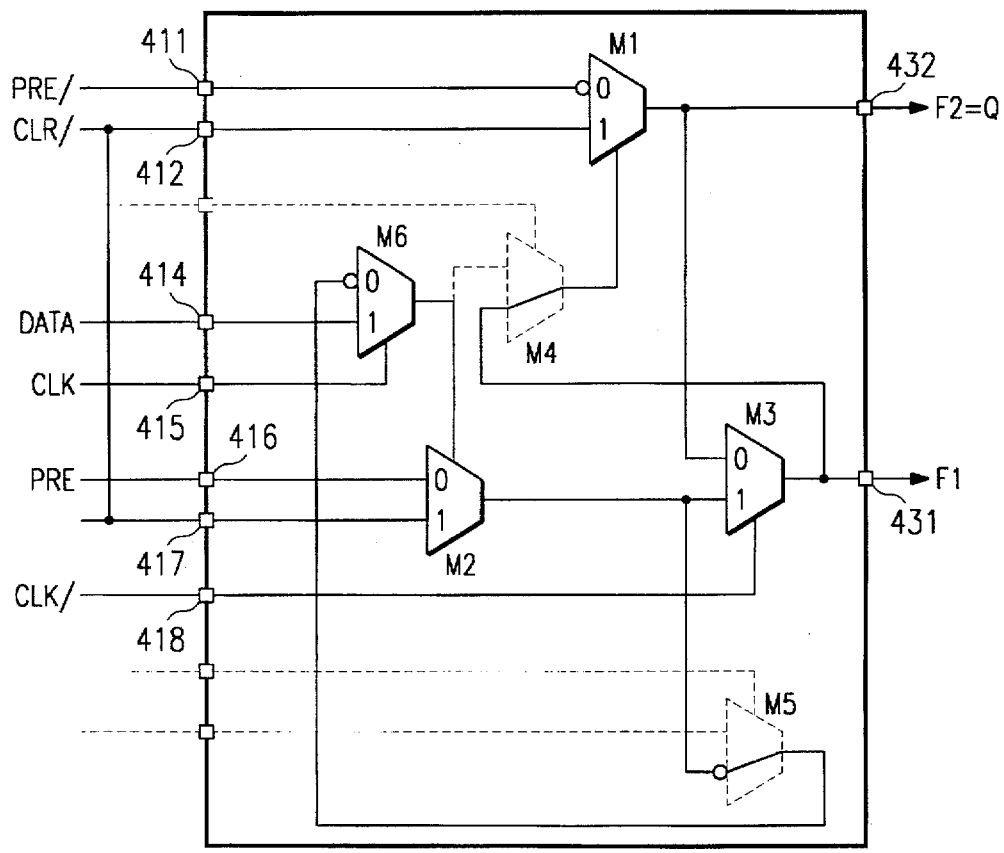

FIG. 10C illustrates a simple D flipflop 480 comprised of two muxes, 481 and 482, which also function as simple D latches 481 and 482. A clock signal CLK is applied to mux 482 and an inverted clock signal CLK/ is applied to mux 481. Flipflop 480 functions similarly to flipflop 470 except the preset and clear function is not provided. Flipflop 480 illustrates the operation of a flipflop when signal CLK/ is applied to the first D latch 481 and CLK is applied to the second D latch 482. In this case, the flipflop triggers on the low to high transition of signal CLK, referred to as positive edge triggering.

The D flipflop circuit that is configured in module 400 and illustrated in FIG. 10D operates similarly to flipflop 470 of FIG. 10B. A data signal DATA is applied to input terminal 414. A clock signal CLK is applied to input terminal 415. An inverted clock signal CLK/ is applied to input terminal 418. A preset signal PRE is applied to terminal 416 and an inverted preset signal PRE/ is applied to input 411. An inverted clear signal CLR/ is applied to terminal 412 and 417. Muxes M6 and M2 with mux M5 providing feedback operate as a D latch, as described earlier, and function as a first D latch similar to latch 471. Muxes M1 and M2 function as a second D latch similar to latch 472. Clock signal CLK is applied to mux M6. Inverted clock signal CLK/ is applied to mux M3. Signal 443 is output via output terminal 431 as signal Q, which represents the state of the D flipflop of module 400.

Referring again to FIG. 10D, the D flipflop of module 400 is advantageously triggered when clock signal CLK transitions from either high to low or low to high. This feature is implemented by connecting signals CLK and CLK/ in different order. When signal CLK is connected to input 415 and CLK/ is connected to input 418, the D flipflop of module 400 operates as a negative edge triggered flipflop. That is, input signal DATA is passed through to output signal Q when clock signal CLK transitions from a high to a low. Likewise, when signal CLK connected to input 418 and CLK/ is connected to 415, the D flipflop of module 400 operates as a positive edge triggered flipflop, wherein the signal DATA is passed through to output Q when signal CLK transitions from low to high.

Figure 11A:
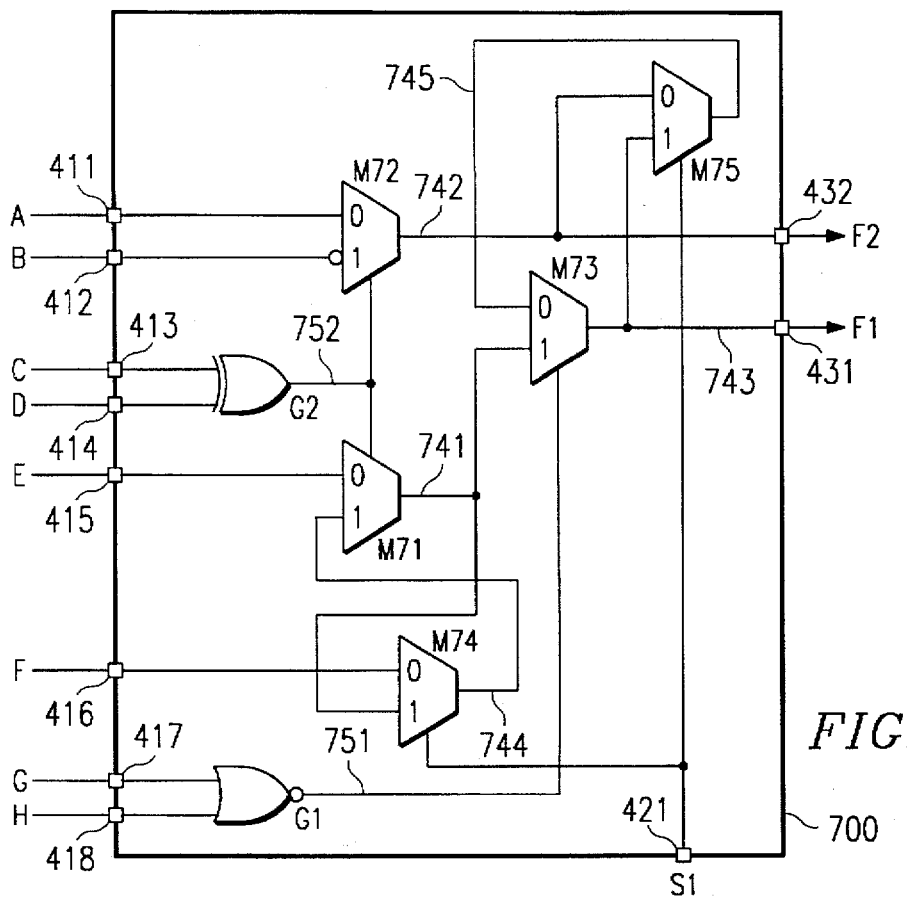
FIGS. 11A–11D illustrate other embodiments of a logic module formed in accordance with the present invention.
Figure 11B:
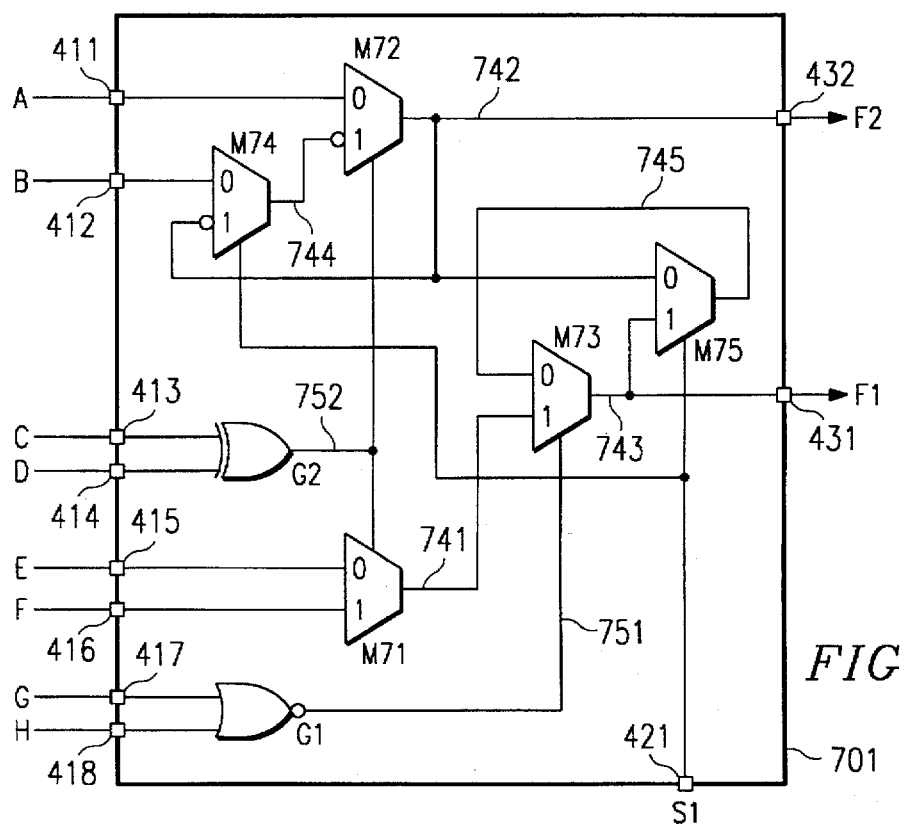
Figure 11C:
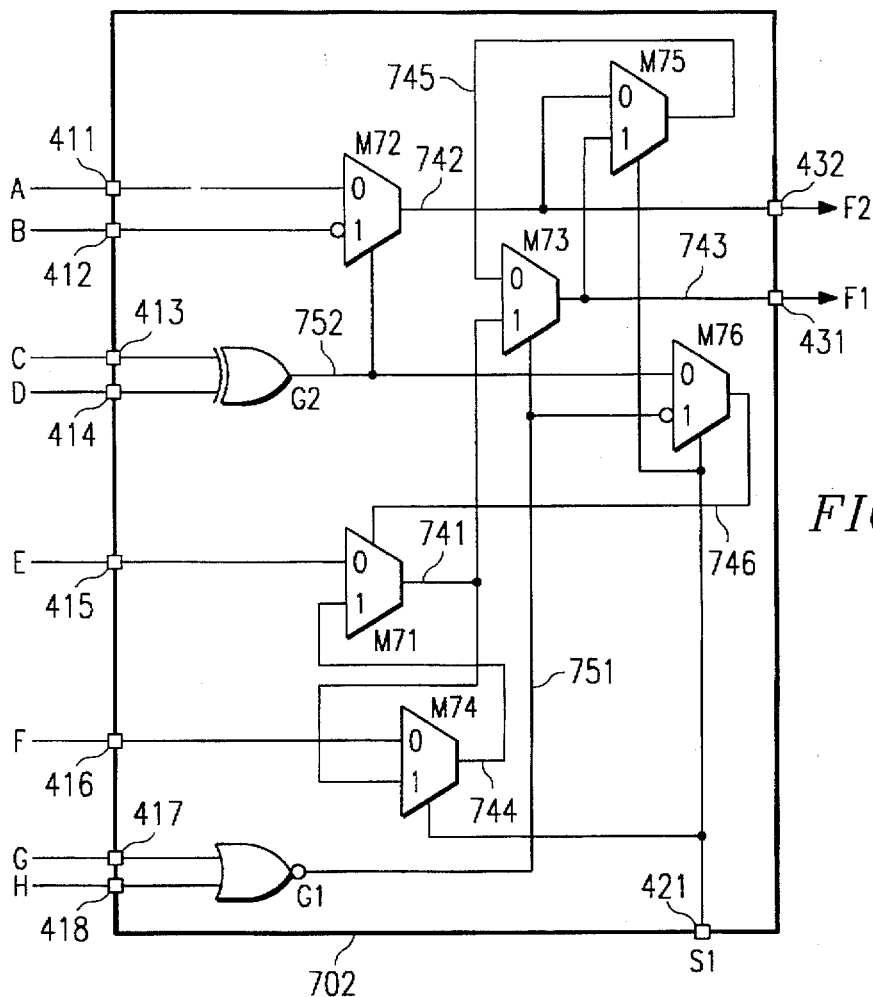
Figure 11D:
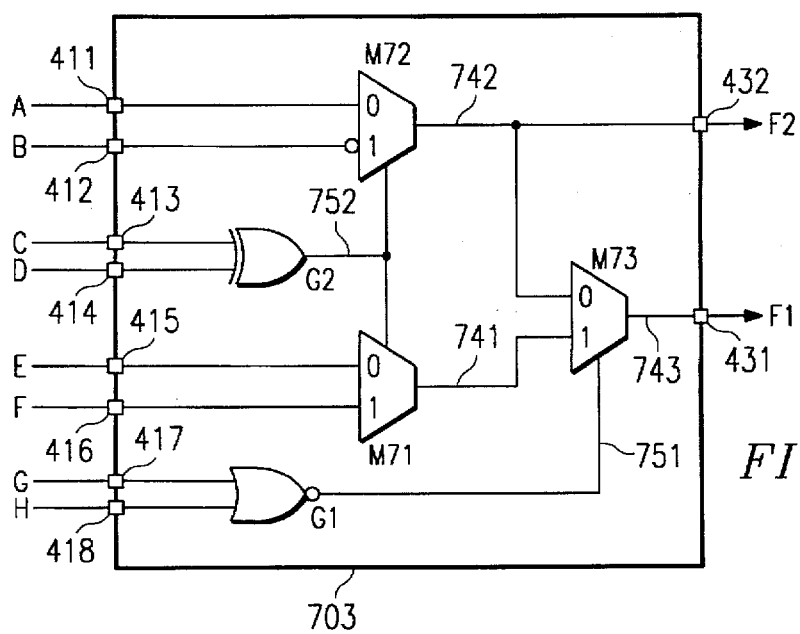

FIG. 11D illustrates a core logic module 703 that can be modified in several ways to result in a derivative module which is implemented in accordance with the present invention.

A mux M71 has a 0-input connected to an input terminal 415, a 1-input connected to an input terminal 416, a select control connected to output 752 of gate G2, and an output 741.

A mux M72 has a 0-input connected to an input terminal 411, an inverting 1-input connected to an input terminal 412, a select control connected to output 752 of gate G2, and an output 742 connected to output terminal 432.

A mux M73 has a 0-input connected to an output 742 of a mux M72, a 1-input connected to output 741 of mux M71, a select control connected to an output 751 of a gate G1, and an output 743 connected to output terminal 431.

The NOR gate G1 has a first input connected to input terminal 417, a second input connected to input terminal 418, and an output 751.

The XOR gate G2 has a first input connected to input terminal 413, a second input connected to input terminal 414, and an output 752.

Still referring to FIG. 11D, logic module 703 may be reconfigured to form pure combinational logic circuits and a full adder circuit, as shown in TABLE 2. As shown in TABLE 3, any one of 1364 combinational functions of the input terminals can be formed on output 431.

TABLE 2

| S1 | CONFIGURATION | Mux PATH | FEED BACK |
|---|---|---|---|
| 0 | Combinational | | |
| 0 | Adder | | |
| | $A = B = F = C_{IN}$, $C = X$, $D = E = Y$, $G = H = 0$, | | |
| | $F2 = SUM$, $F1 = C_{out}$ | | |

TABLE 3

| FUNCTIONS OF | | LOGIC MODULE 703 | |
|---|---|---|---|
| "N" VARIABLES | PRIOR ART | OUTPUT 431 | OUTPUT 432 |
| 1 | 2 | 2 | 2 |
| 2 | 8 | 8 | 8 |
| 3 | 48 | 62 | 7 |
| 4 | 238 | 490 | 1 |
| 5 | 319 | 585 | — |
| 6 | 130 | 292 | — |

TABLE 3-continued

| FUNCTIONS OF | LOGIC MODULE 703 | | |
|---|---|---|---|
| "N" VARIABLES | PRIOR ART | OUTPUT 431 | OUTPUT 432 |
| 7 | 20 | 24 | — |
| 8 | 1 | 1 | — |
| Total | 766 | 1364 | 18 |

FIG. 11A illustrates logic module 700 which is implemented in accordance with the present invention. A mux M74 provides feedback for mux M71 and a mux M75 provides feedback for mux M73.

Mux M71 has a 0-input connected to an input terminal 415, a 1-input connected to an output 744 of a mux M74, a select control connected to output 752 of gate G2, and an output 741.

Mux M72 has a 0-input connected to an input terminal 411, an inverting 1-input connected to an input terminal 412, a select control connected to output 752 of gate G2, and an output 742 connected to output terminal 432.

Mux M73 has a 0-input connected to an output 745 of a mux M75, a 1-input connected to output 741 of mux M71, a select control connected to an output 751 of a gate G1, and an output 743 connected to output terminal 431.

Mux M74 has a 0-input connected to an input terminal 416, a 1-input connected to output 741 of mux M71, a select control connected to a control input 421, and an output 744.

Mux M75 has a 0-input connected to output 742 of mux M72, a 1-input connected to output 743, a select control connected to control input 421, and an output 745.

The NOR gate G1 has a first input connected to input terminal 417, a second input connected to input terminal 418, and an output 751.

The XOR gate G2 has a first input connected to input terminal 413, a second input connected to input terminal 414, and an output 752.

Still referring to FIG. 11A, logic module 700 may be reconfigured to form any one of the following circuits in response to control input signal S1 as shown in TABLE 4: pure combinational logic, full adder, D latch, and D flipflop.

TABLE 4

| S1 | CONFIGURATION | Mux PATH | FEED BACK |
|---|---|---|---|
| 0 | Combinational | | |
| 0 | Adder<br>A = B = F = $C_{IN}$, C = X,<br>D = E = Y, G = H = 0,<br>F2 = SUM, F1 = $C_{out}$ | | |
| 1 | D-latch<br>A = B = F = H = 0, C = D = 1,<br>E = DATA, G = CLK/, F1 = Q | M71-M73-M75 | M75 |
| 1 | D-flipflop<br>A = B = F = H = 0, D = 1,<br>E = DATA, C = G = CLK/,<br>F1 = Q | M71-M74-M73-M75 | M74<br>M75 |

FIG. 11B illustrates logic module 701 which is implemented in accordance with the present invention. A mux M74 provides feedback for mux M72 and a mux M75 provides feedback for mux M73.

Mux M71 has a 0-input connected to an input terminal 415, a 1-input connected to an input terminal 416, a select control connected to output 752 of gate G2, and an output 741.

Mux M72 has a 0-input connected to an input terminal 411, an inverting 1-input connected an output 744 of a mux M74, a select control connected to output 752 of gate G2, and an output 742 connected to output terminal 432.

Mux M73 has a 0-input connected to an output 745 of a mux M75, a 1-input connected to output 741 of mux M71, a select control connected to an output 751 of a gate G1, and an output 743 connected to output terminal 431.

Mux M74 has a 0-input connected to an input terminal 412, an inverting 1-input connected to output 742 of mux M72, a select control connected to a control input 421, and an output 744.

Mux M75 has a 0-input connected to output 742 of mux M72, a 1-input connected to output 743, a select control connected to control input 421, and an output 745.

The NOR gate G1 has a first input connected to input terminal 417, a second input connected to input terminal 418, and an output 751.

The XOR gate G2 has a first input connected to input terminal 413, a second input connected to input terminal 414, and an output 752.

Still referring to FIG. 11B, logic module 701 may be reconfigured to form any one of the following circuits in response to control input signal S1 as shown in TABLE 5: pure combinational logic, full adder, D latch, and D flipflop.

TABLE 5

| S1 | CONFIGURATION | Mux PATH | FEED BACK |
|---|---|---|---|
| 0 | Combinational | | |
| 0 | Adder<br>A = B = F = $C_{IN}$, C = X,<br>D = E = Y, G = H = 0,<br>F2 = SUM, F1 = $C_{out}$ | | |
| 1 | D-latch<br>A = B = C = D = F = H = 0,<br>E = DATA, G = CLK/,<br>F1 = Q | M71-M73-M75 | M75 |
| 1 | D-flipflop<br>A = DATA, B = H = 0,<br>C = G = CLK/, D = 1,<br>E = F = F2, F1 = Q | M72-M74-M71-M73-M75 | M74<br>M75 |

FIG. 11C illustrates logic module 702 which is implemented in accordance with the present invention. A mux M74 provides feedback for mux M71 and a mux M75 provides feedback for mux M73. A mux M76 controls the select input of mux M71.

Mux M71 has a 0-input connected to an input terminal 415, a 1-input connected to an output 744 of a mux M74, a select control connected to output 746 of a mux M76, and an output 741.

Mux M72 has a 0-input connected to an input terminal 411, an inverting 1-input connected to an input terminal 412, a select control connected to an output 752 of a gate G2, and an output 742 connected to output terminal 432.

Mux M73 has a 0-input connected to an output 745 of a mux M75, a 1-input connected to output 741 of mux M71, a select control connected to an output 751 of a gate G1, and an output 743 connected to output terminal 431.

Mux M74 has a 0-input connected to an input terminal 416, a 1-input connected to output 741 of mux M71, a select control connected to a control input 421, and an output 744.

Mux M75 has a 0-input connected to output 742 of mux M72, a 1-input connected to output 743 of mux M73, a select control connected to control input 421, and an output 745.

Mux M76 has a 0-input connected to output 752 of gate G2, an inverting 1-input connected to output 751 of gate G1, a select control connected to control input 421, and an output 746.

NOR gate G1 has a first input connected to input terminal 417, a second input connected to input terminal 418, and an output 751.

XOR gate G2 has a first input connected to input terminal 413, a second input connected to input terminal 414, and an output 752.

Still referring to FIG. 11C, logic module 702 may be reconfigured to provide any one of the following functions in response to control input signal S1 as shown in TABLE 6: pure combinational logic, full adder, D latch, and D flipflop.

TABLE 6

| S1 | CONFIGURATION | Mux PATH | FEED BACK |
|----|---------------|----------|-----------|
| 0 | Combinational | | |
| 0 | Adder<br>A = B = F = $C_{IN}$, C = X,<br>D = E = Y, G = H = 0,<br>F2 = SUM, F1 = $C_{out}$ | | |
| 1 | D-latch<br>A = B = C = D = F = H = 0,<br>E = DATA, G = CLK/, F1 = Q | M71-M73-M75 | M75 |
| 1 | D-flipflop<br>A = B = F = H = 0,<br>C = G = CLK/, D = 1,<br>E = DATA, F1 = Q | M71-M74-M73-M75 | M74<br>M75 |

Logic modules have been shown to advantageously provide a rich set of combinational functions as well as a full adder. The availability of the full adder circuit in logic modules helps in building adders, subtractors and multipliers easily. The logic modules are well suited for digital signal processing applications.

An advantage of the logic modules is that by reconfiguring the logic elements to perform both combinational and sequential functions, the size of the module is minimized. Furthermore, propagation delay of an output signal is advantageously reduced by implementing sequential functions of a latch and D flipflop within the module rather than by interconnecting two or more prior art modules.

Shift registers may be efficiently formed using a plurality of logic modules configured as D latches or D flipflops.

Preset and clear functions on the D latch and D flipflop of module 400 are advantageous in many uses of the module.

Combinational functions on signal DATA when module 400 is configured to be a D latch may be advantageous in many applications.

Another advantage of the modules is the flexibility of configuring the D flipflop to have positive or negative triggering.

Another advantage of the logic modules is the designation of inputs S1 and S2 as control inputs. By limiting their use to a fixed high or low after programming, only two antifuses are needed for each of inputs S1 and S2. Furthermore, a plurality of modules may have inputs S1 and S2 connected together in an FPGA so that only two antifuses are required for each control line to configure the plurality of modules, advantageously reducing the total number of antifuses in the FPGA and advantageously reducing the capacitive load on the effected signals.

As used herein, the terms "applied", "connected" and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A logic module for use in a field programmable gate array integrated circuit comprising:

a plurality of input terminals, a plurality of output terminals, a plurality of logic elements, and an interconnection network interconnecting said input terminals, logic elements and output terminals; the logic elements being configurable to form within a single said logic module preselected types of sequential and combinational logic functions in response to predetermined combinations of control signals placed on certain of said input terminals;

wherein said logic module has no active elements except for said logic elements and wherein each logic element consists of a multiplexer: and wherein at least one of said preselected types of combinational logic function is a full adder with carry.

2. The logic module for use in a field programmable gate array integrated circuit of claim 1, wherein:

said interconnection network and said logic elements being responsive to said first combination of signals on at least some of said input terminals to form a boolean combination of other said input terminals at said output terminals;

said interconnection network and said logic elements being responsive to said second combination of signals on at least some of said input terminals to form an arithmetic sum of certain other said input terminals on one of said output terminals and an arithmetic carry out on a second one of said output terminals; said interconnection network and said logic elements being responsive to said third combination of signals on at least some of said input terminals to form a D latch which sequentially latches a representation of a signal at a certain one of said input terminals in response to a logic level of a clock signal and an inverted clock signal at another two of said input terminals and places a resultant latched signal on one of said output terminals; and said interconnection network and said logic elements being responsive to said fourth combination of signals on at least some of said input terminals to form a D flipflop which sequentially latches a representation of a signal at a certain one of said input terminals in response to a logic transition of a clock signal and an inverted clock signal at another two of said input terminals and places a resultant latched signal on one of said output terminals.

3. The logic module for use in a field programmable gate array integrated circuit of claim 1, wherein:

each logic element comprises a multiplexer having a first and a second input, a select control and an output.

4. The logic module for use in a field programmable gate array integrated circuit of claim 2, wherein the D latch further comprises:

a preset input which is responsive to a signal placed on another input terminal of said input terminals; and a clear input which is responsive to a signal placed on another input terminal of said input terminals.

5. The logic module for use in a field programmable gate array integrated circuit of claim 2, wherein the D flipflop further comprises:

a preset input which is responsive to a signal placed on another input terminal of said input terminals; and a clear input which is responsive to a signal placed on another input terminal of said input terminals.

6. The logic module for use in a field programmable gate array integrated circuit of claim 1, wherein:

a plurality of externally generated input signals is received by said input terminals.

7. The logic module for use in a field programmable gate array integrated circuit of claim 1, wherein said interconnection network and said logic elements further comprise:

a first mux has a 0-input connected to a fifth input terminal, a 1-input connected to an output of a fourth mux, a select control connected to an output of an exclusive-OR gate, and an output;

a second mux has a 0-input connected to an first input terminal, an inverting 1-input connected to a second input terminal, a select control connected to said output of said exclusive-OR gate, and an output connected to a second output terminal;

a third mux has a 0-input connected to an output of a fifth mux, a 1-input connected to said output of said first mux, a select control connected to an output of a NOR gate, and an output connected to a first output terminal;

a fourth mux has a 0-input connected to a sixth input terminal, a 1-input connected to said output of said first mux, a select control connected to a certain one of said input terminals designated as a control input terminal, and an output;

said fifth mux has a 0-input connected to said output of said second mux, a 1-input connected to said output of said third mux, a select control connected to said control input terminal, and an output;

said NOR gate has a first input connected to a seventh input terminal, a second input connected to an eighth input terminal, and an output; and said exclusive-OR gate has a first input connected to a third input terminal, a second input connected to a fourth input terminal, and an output.

8. The logic module for use in a field programmable gate array integrated circuit of claim 1, wherein said interconnection network and said logic elements further comprise:

a first mux has a 0-input connected to a fifth input terminal, a 1-input connected to an a sixth input terminal, a select control connected to an output of an exclusive-OR gate, and an output;

a second mux has a 0-input connected to a first input terminal, an inverting 1-input connected an output of a fourth mux, a select control connected to said output of said exclusive-OR gate, and an output connected to a second output terminal;

a third mux has a 0-input connected to an output of a fifth mux, a 1-input connected to said output of said first mux, a select control connected to an output of a NOR gate, and an output connected to a first output terminal;

said fourth mux has a 0-input connected to a second input terminal, an inverting 1-input connected to said output of said second mux, a select control connected to a certain one of said input terminals designated as a control input terminal, and an output;

said fifth mux has a 0-input connected to said output of said second mux, a 1-input connected to said output of said third mux, a select control connected to said control input terminal, and an output;

said NOR gate has a first input connected to a seventh input terminal, a second input connected to an eighth input terminal, and an output; and said exclusive-OR gate has a first input connected to a third input terminal, a second input connected to a fourth input terminal, and an output.

9. The logic module for use in a field programmable gate array integrated circuit of claim 1, wherein said interconnection network and said logic elements further comprise:

a first mux has a 0-input connected to a fifth input terminal, a 1-input connected to an output of a fourth mux, a select control connected to an output of a sixth mux, and an output;

a second mux has a 0-input connected to an first input terminal, an inverting 1-input connected to a second input terminal, a select control connected to an output of an exclusive-OR gate, and an output connected to a second output terminal;

a third mux has a 0-input connected to an output of a fifth mux, a 1-input connected to said output of said first mux, a select control connected to an output of a NOR gate, and an output connected to a first output terminal;

a fourth mux has a 0-input connected to a sixth input terminal, a 1-input connected to said output of said first mux, a select control connected to a certain one of said input terminals designated as a control input terminal, and an output;

said fifth mux has a 0-input connected to said output of said second mux, a 1-input connected to said output of said third mux, a select control connected to said control input terminal, and an output;

said sixth mux has a 0-input connected to said output of said exclusive-OR gate, an inverting 1-input connected to said output of said NOR gate, a select control connected to said first control input terminal, and an output;

said NOR gate has a first input connected to a seventh input terminal, a second input connected to an eighth input terminal, and an output; and said exclusive-OR gate has a first input connected to a third input terminal, a second input connected to a fourth input terminal, and an output.

10. A logic module for use in a field programmable gate array integrated circuit, comprising:

a plurality of input terminals, two output terminals, a plurality of logic elements, and an interconnection network interconnecting said input terminals, logic elements, and two output terminals:

said interconnection network and said logic elements further comprising:

a first mux having an inverting 0-input connected to a first one of said input terminals, a 1-input connected to a second one of said input terminals, a select control connected to an output of a fourth mux, and an output connected to one of said output terminals;

a second mux having a 0-input connected to a sixth one of said input terminals, a 1-input connected to a seventh one of said input terminals, a select control connected to an output of a sixth mux, and an output;

a third mux having a 0-input connected to said output of said first mux, a 1-input connected to said output of said second mux, a select control connected to an eighth one of said input terminals, and an output connected to a another of said output terminals;

said fourth mux having a 0-input connected to said output of said sixth mux, a 1-input connected to said output of said third mux, a select control connected to a first one of certain said input terminals designated as control input terminals, and an output;

a fifth mux having a 0-input connected to a third one of said input terminals, an inverting 1-input connected to said output of said second mux, a select control connected to a second one of certain said input terminal designated as control input terminals, and an output; and said sixth mux having an inverting 0-input connected to said output of said fifth mux, a 1-input connected to a fourth one of said input terminals, a select control connected to a fifth one of said input terminals, and an output.

11. A logic module for use in a field programmable gate array integrated circuit comprising:

a plurality of input terminals, two output terminals, a plurality of logic elements, and an interconnection network interconnecting said input terminals, logic elements, and two output terminals:

said interconnection network and said logic elements further comprising:

a first mux has a 0-input connected to a fifth input terminal, a 1-input connected to a sixth input terminal, a select control connected to an output of an exclusive-OR gate, and an output;

a second mux has a 0-input connected to a first input terminal, an inverting 1-input connected to a second input terminal, a select control connected to said output of said exclusive-OR gate, and an output connected to a second output terminal;

a third mux has a 0-input connected to said output of said second mux, a 1-input connected to said output of said first mux, a select control connected to an output of a NOR gate, and an output connected to a first output terminal;

said NOR gate has a first input connected to a seventh input terminal, a second input connected to an eighth input terminal, and an output;

said exclusive-OR gate has a first input connected to a third input terminal, a second input connected to a fourth input terminal, and an output.

12. A field programmable gate array integrated circuit comprising:

an array of logic modules;

a first interconnection network for selectively interconnecting said logic modules;

wherein said logic modules comprise:

a plurality of input terminals, a plurality of output terminals, a plurality of logic elements, and a second interconnection network interconnecting said input terminals, logic elements and output terminals; the logic elements being configurable to form within a single said logic module preselected types of sequential and combinational logic function in response to predetermined combinations of control signals placed on certain of said input terminals;

wherein said logic module has no active elements except for said logic elements and wherein each logic element consists of a multiplexer; and wherein at least one of said preselected types of combinational logic function is a full adder with carry.

13. The field programmable gate array integrated circuit of claim 12, wherein:

said second interconnection network and said logic elements being responsive to said first combination of signals on at least some of said input terminals to form a Boolean combination of other said input terminals at said output terminals;

said second interconnection network and said logic elements being responsive to said second combination of signals on at least some of said input terminals to form an arithmetic sum of certain other said input terminals on one of said output terminals and an arithmetic carry out on a second one of said output terminals;

said second interconnection network and said logic elements being responsive to said third combination of signals on at least some of said input terminals to form a D latch which sequentially latches a representation of a signal at a certain one of said input terminals in response to a logic level of a clock signal and an inverted clock signal another two of said input terminals and places a resultant latched signal on one of said output terminals; and said second interconnection network and said logic elements being responsive to said fourth combination of signals on at least some of said input terminals to form a D flip-flop which sequentially latches a representation of a signal at a certain one of said input terminals in response to a logic transition of a clock signal and an inverted clock signal at another two of said input terminals and places a resultant latched signal on one of said output terminals.

14. The field programmable gate array integrated circuit of claim 12, wherein:

each logic element comprises a multiplexer having a first and a second input, a select control and an output.

15. The field programmable gate array integrated circuit of claim 12, wherein:

said first interconnection network comprises fuses and antifuses; and a preselected input terminal of each module of a plurality of said logic modules is connected to a same single fuse or antifuse of said first interconnection network.

16. A logic module for use in a field programmable gate array integrated circuit comprising:

a plurality of input terminals, a plurality of output terminals, a plurality of logic elements, and an interconnection network interconnecting said input terminals, logic elements and output terminals; the logic elements being configurable to form within a single said logic module preselected types of sequential and combinational logic functions in response to predetermined combinations of control signals placed on certain of said input terminals;

wherein said logic module has no active elements except for said logic elements and wherein each logic element consists of either a multiplexer or a gate; and wherein at least one of said preselected types of combinational logic function is a full adder with carry.

17. The logic module of claim 16, wherein a majority of said logic elements are multiplexors.

* * * * *